United States Patent [19]
Zhang et al.

[11] Patent Number: 5,977,559
[45] Date of Patent: Nov. 2, 1999

[54] THIN-FILM TRANSISTOR HAVING A CATALYST ELEMENT IN ITS ACTIVE REGIONS

[75] Inventors: Hongyong Zhang; Toru Takayama; Yasuhiko Takemura, all of Kanagawa, Japan

[73] Assignee: Semiconductor Energy Laboratory Co., Ltd., Kanagawa-ken, Japan

[21] Appl. No.: 09/048,014

[22] Filed: Mar. 26, 1998

Related U.S. Application Data

[62] Division of application No. 08/536,162, Sep. 29, 1995.

[51] Int. Cl.[6] ............................................. H01C 31/036
[52] U.S. Cl. .......................... 257/57; 257/66; 257/59; 257/72; 257/347; 257/348; 257/349; 257/350; 257/351; 257/352; 257/353
[58] Field of Search ........................... 257/57.66, 59, 257/72, 347–353

[56] References Cited

U.S. PATENT DOCUMENTS

| | | | |
|---|---|---|---|
| 5,112,764 | 5/1992 | Mitra et al. | 437/40 TFT |
| 5,147,826 | 9/1992 | Liu et al. | 437/233 |
| 5,275,851 | 1/1994 | Fonash et al. | 437/233 |
| 5,501,989 | 3/1996 | Takayama et al. | 437/21 |
| 5,576,556 | 11/1996 | Takemura et al. | 257/69 |
| 5,595,923 | 1/1997 | Zhang et al. | 146/DIG. 16 |
| 5,773,846 | 6/1998 | Zhang et al. | 257/347 |
| 5,789,762 | 8/1998 | Koyama et al. | 257/65 |

FOREIGN PATENT DOCUMENTS

| | | |
|---|---|---|
| 6-267976 | 12/1994 | Japan . |
| 6-267979 | 12/1994 | Japan . |
| 6-267980 | 12/1994 | Japan . |
| 6-268212 | 12/1994 | Japan . |
| 6-333951 | 12/1994 | Japan . |

OTHER PUBLICATIONS

Liu et al., "Polycrystalline Silicon Thin Film Transistors on Corning 7059 Glass Substrates Using Short Time, Low–Temperature Processing", Appl. Phys. Lett., vol. 62, No. 20, May 17, 1983, pp. 2554–2556.

Liu et al., "Selective Area Crystallization of Amorphous Silicon Films by Low–Temperature Rapid Thermal Annealing", Appl. Phys. Lett., vol. 55, No. 7, Aug. 14, 1989, pp. 660–662.

Lee at al., "Low Temperature Poly–Si TFT Fabrication by Nickel–Induced Lateral Crystallization of Amorphous Silicon Films", AM–LCD '95 Proceedings, p. 113, Aug. 1995

Wada et al., "Grain Gowth Mechanism of Heavily P–Implanted Poly–Si", J. Electrochem. Soc., vol. 125, No. 9, p. 1499, Sep. 1978.

Primary Examiner—Fetsum Abraham
Attorney, Agent, or Firm—Sixbey, Friedman, Leedom & Ferguson, PC; Eric J. Robinson

[57] ABSTRACT

A thin-film transistor (TFT) which has a crystalline silicon active layer of excellent reliability and characteristics, and a method of fabricating such a TFT inexpensively are provided. In a TFT which has at least two low density impurity regions and a source/drain adjacent to a channel-forming region, catalyst elements which cause amorphous silicon to crystallize are included in the source/drain, and the density of said catalyst elements in the interface between the channel-forming region and the low-density impurity regions is less than that in the source/drain.

20 Claims, 4 Drawing Sheets

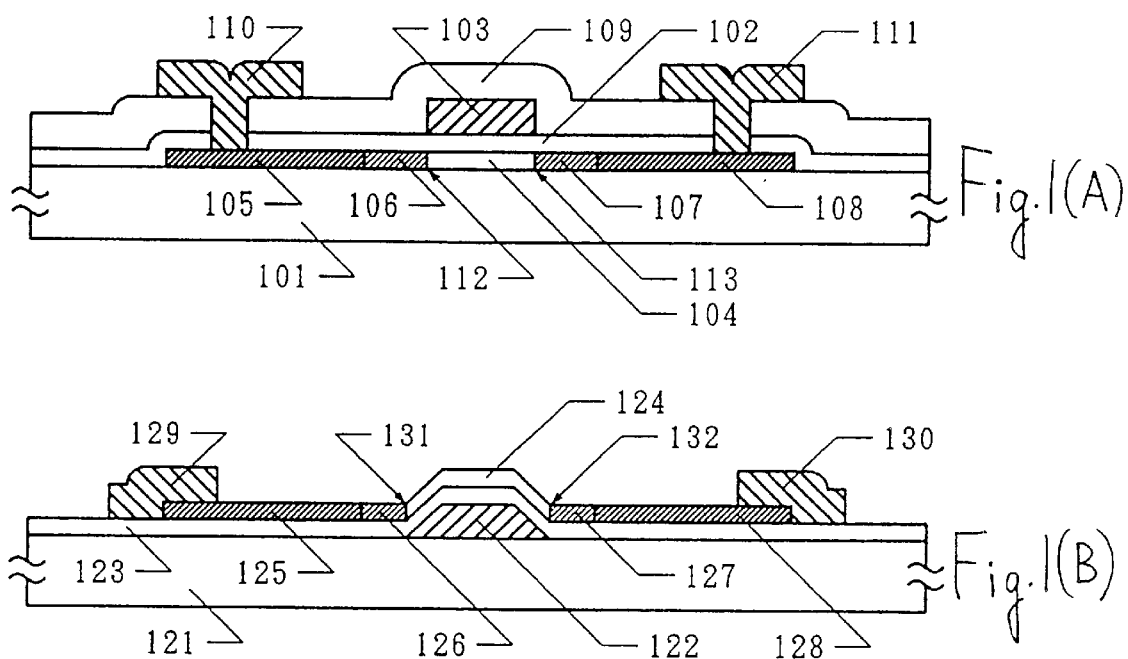

THIN-FILM TRANSISTOR HAVING A CATALYST ELEMENT IN ITS ACTIVE REGIONS

This application is a Divisional Application of Ser. No. 08/536,162, Sep. 29, 1995.

BACKGROUND OF THE INVENTION

1. Field of the Invention

The present invention relates to a highly reliable thin-film transistor (TFT) and a fabrication method thereof. The thin-film transistor which is fabricated according to the present invention has the characteristic that it is formed on an insulating surface. In the present invention, an insulating surface does not only mean an insulating surface such as glass, but also includes an insulating covering which is provided on a semiconductor substrate such as amorphous silicon. In particular, the present invention relates to a thin-film transistor which has a process in which the source/drain regions are activated by thermal annealing.

2. Description of the Related Art

Research has been conducted recently on insulating gate-type semiconductor devices which have a thin-film semiconductor layer (also referred to as an active layer or active region) which is provided on an insulating surface. In particular, thin-film insulated gate transistors, so-called thin-film transistors (TFT) are earnestly studied. These are used in the drive circuits of matrix circuits, or for controlling pixels in an image device such as a liquid crystal display device which has a matrix construction formed on an insulating substrate, and they are also used in integrated circuits which have a three-dimensional construction, in which semiconductor integrated circuits are formed in multiple layers. TFTs are classified as amorphous silicon TFTs or crystalline silicon TFTs, depending on the material and crystalline form of the semiconductor being used.

In general the electric field mobility of semiconductors in the amorphous state is low, and they can therefore not be used in TFTs, which require high speed operation. Further, the P-type electric field mobility of amorphous silicon is very low, and therefore P-channel type TFTs (PMOS TFTs) cannot be fabricated, and it is consequently impossible to form complementary MOS circuits (CMOS) by combining with an N-channel type TFT (NMOS TFT).

However, the electric field mobility of crystalline semiconductors is higher than that of amorphous semiconductors, and therefore high speed operation is possible. Furthermore, with crystalline silicon, not only can NMOS TFTs be obtained, but also PMOS TFTs can be obtained in the same way, and therefore CMOS circuits can be formed; for example in an active matrix type liquid crystal display device, not only can the active matrix circuits, but also the peripheral circuits (driver circuit etc.) which drive this can be constructed on one and the same substrate using CMOS crystalline TFTs, and it is possible to obtain a so-called monolithic construction.

Recently, in order to reduce deterioration due to hot carriers, there has been a demand for the provision of low density impurity regions adjacent to the source or the drain regions, in which the density of N-type or P-type impurities is less than in the source/drain regions.

SUMMARY OF THE INVENTION

The problem in fabricating crystalline silicon TFTs is the process of activating the source/drain regions. The source/drain regions of a crystalline TFT and the low density impurity regions are normally formed by accelerating impurity ions which impart N-type or P-type conductor characteristics, and implanting them in a silicon film, as in the ion implantation method and the ion doping method, but at this time the silicon film is rendered amorphous by the ion impacts. Thus the sheet resistance of the source/drain regions in this amorphous state is extremely high.

With TFTs in which the semiconductor active layer is in the amorphous state, since the electric field mobility at first was small, such TFTs were useful provided that the sheet resistance of the source/drain regions was between approximately 10 kΩ/□ and 1 MΩ/□. However, since the electric field mobility with crystalline TFTs is high, it was not possible to obtain characteristics suitable for crystalline TFTs unless the sheet resistance was less than 10 kΩ/□. It was thus necessary to increase the crystallinity of the amorphous source/drain regions (activation).

In the activation process, most of the portions of the TFT elements, beginning with the gate electrode, are formed, and it is necessary to avoid damaging them. It is possible to use a thermal annealing process for the activation. This method has the feature that there is little variation between batches.

The temperature and time required for activation depends on the density of impurities. Thus whereas it is possible to perform activation at a relatively low temperature and for a short time by thermal annealing for the low density regions, regions in which impurities are implanted at high density, such as the source/drain regions require thermal annealing at high temperature for a long time. However, the gate electrode and substrate are liable to be greatly affected by thermal annealing at high temperature for a long time.

Normally, for a region in which impurities are implanted at a density of at least $1\times10^{20}$ atoms/cm$^3$ (at least $1\times10^{14}$ atoms/cm$^3$ when converted to a dosage), thermal annealing at a temperature of approximately 600° C. for a long time, or thermal annealing at a high temperature in excess of 1000° C. is required. If the latter method is adopted then selection of the substrate is limited to quartz, and the cost of the substrate becomes extremely high. On the other hand, although the former method has wide scope for selection of the substrate, the reduction in productivity due to thermal annealing for a long time is a major problem.

Further, in order to reduce the effects of heat on other portions of the element to a minimum (for example pattern slippage and the like due to shrinkage and distortion of the substrate) there has been a demand for activation by thermal annealing at lower temperatures and for a short time.

As a result of research by the present inventors it was discovered that by adding a trace amount of a catalyst material to a silicon covering in essentially an amorphous state it is possible to promote crystallization, lower the crystallization temperature and shorten the crystallization time. Suitable catalyst elements are nickel (Ni), iron (Fe), cobalt (Co), platinum (Pt) and palladium (Pd), either alone or in the form of compounds.

Specifically, methods for adding these catalyst elements to the silicon film include methods in which a film, particles or clusters, for example, containing the catalyst elements is formed such that it is essentially bonded below or above the amorphous silicon film, and methods in which the catalyst elements are introduced into the amorphous silicon film by a method such as ion implantation. After this it is possible to perform crystallization by thermal annealing the amorphous silicon film at a suitable temperature (typically a temperature of 580° C. or less).

Naturally, the relationship between temperature and time is such that as the annealing temperature increases, so the time required for crystallization decreases. Further, there is a relationship such that as the density of nickel, iron, cobalt or platinum, for example increases, so the temperature required for crystallization is reduced, and the time required for crystallization is reduced. Research by the present inventors showed that in order to promote crystallization, the density of at least one of these elements must exceed $1\times10^{17}/cm^3$ in the amorphous silicon film which is to be crystallized.

However, since all of the abovementioned catalyst elements are materials which are not desirable in silicon, it is preferable for the densities thereof to be as low as possible. According to the research of the present inventors, it is desirable that the total density of the catalyst elements should not exceed $10^{20}$ atoms/cm$^3$.

The present inventors concentrated on the advantages of the catalyst elements, and by making use of them they discovered that it was possible to improve the crystallinity of the amorphous source/drain regions. To elaborate, thermal annealing is performed after implantation of the abovementioned catalyst elements into the source/drain regions by a means such as the ion implantation method. Alternatively, by layering the catalyst elements alone, or in the form of oxides, in a covering on the source/drain regions, and performing thermal annealing, the catalyst elements diffuse into the source/drain regions whilst improving crystallinity.

To elaborate, the following processes should be provided in order to fabricate a TFT according to the present invention.

(1) A step in which a low density impurity region is formed (in an amorphous silicon film in which the density of catalyst elements is less than $1\times10^{17}$ atoms/cm$^3$).
(2) A step in which source/drain regions are formed (by ion implantation or ion doping method).
(3) A step in which a material containing the catalyst elements is formed as a film on essentially the same region as the source/drain regions.
(4) A step in which the source/drain regions are activated by thermal annealing (400 to 580° C.). or:
(1) A step in which a low density impurity region is formed (in an amorphous silicon film in which the density of catalyst elements is less than $1\times10^{17}$ atoms/cm$^3$).
(2) A step in which source/drain regions are formed (by ion implantation or ion doping method).
(3) A step in which catalyst elements are introduced into essentially the same region as the source/drain regions (by ion implantation or ion doping method).
(4) A step in which the source/drain regions are activated by thermal annealing (400 to 580° C.).

In these steps, the order of steps (1), (2) and (3) can be changed. For example, the low density impurity region may be formed after the source/drain regions have initially been formed, or the source/drain regions may be formed after initial introduction of the catalyst elements.

A feature of the present invention is that the catalyst elements or the material which contains the catalyst elements in step (3) mentioned above is not intentionally introduced, and does not form a film, in the portions of the active layer substantially other than the source/drain regions, for example the channel-forming region or the low density impurity region.

FIG. 1 shows the construction of a TFT which is obtained by performing the abovementioned step. FIG. 1 (A) shows an example of a coplanar type, and FIG. 1 (B) shows an example of a reverse stagger type. A description will now be given relating to FIG. 1 (A). A crystalline silicon active layer is provided on an insulating surface 101, and said silicon active layer consists of a channel-forming region 104, a source region 105, a drain region 108, and low density impurity regions 106 and 107 between the source/drain regions 105 and 108 and the channel-forming region 104.

A gate insulating film 102 covering the active layer, and a gate electrode 103 are provided. An insulating layer 109 is provided covering the gate electrode 103, contact holes are formed in the insulating layer 109, and electrodes 110 and 111 are formed to the source/drain regions 105 and 108.

In the present invention, the catalyst elements are mainly introduced into the source/drain regions 105 and 108, thereby improving the crystallinity of these portions. A feature is that the density of the catalyst elements within the source/drain regions 105 and 108 exceeds $1\times10^{17}$ atoms/cm$^3$. Another feature is that a portion of the catalyst elements is also thermally diffused into the low density impurity regions 106 and 107, but the density thereof is sufficiently low, and in particular the density in the interfaces 112 or 113 with the channel-forming region 104 is less than $1\times10^{17}$ atoms/cm$^3$. Naturally, the density of the catalyst elements in the channel-forming region 104 is less than $1\times10^{17}$ atoms/cm$^3$.

Here, the density of the catalyst elements in the source/drain regions 105 and 108 is a value which is measured by secondary ion mass spectrometry (SIMS) of the silicon film, and is the minimum value for a case in which the catalyst element is dispersed in the thickness direction of the film. Further, the density of the catalyst elements within the channel-forming region 104 and the interfaces 112 and 113 with the channel-forming region 104 are average values in the thickness direction of the silicon film.

A description will now be given relating to FIG. 1 (B). A gate electrode 122 is provided on an insulating surface 121, and a gate insulating film 123 is provided thereon, and on top of this a crystalline silicon active layer is provided. The silicon active layer consists of a channel-forming region 124, a source region 125, a drain region 128, and low density impurity regions 126 and 127 between the source/drain regions 125 and 128 and the channel-forming region 124. Electrodes 129 and 130 are formed on the source/drain regions 125 and 128. An interlayer insulating layer may also be provided on the active layer.

In this case also, the catalyst elements are mainly introduced into the source/drain regions 125 and 128, thereby improving crystallinity of these portions. A feature is that the density of the catalyst elements within the source/drain regions 125 or 128 exceeds $1\times10^{17}$ atoms/cm$^3$. Another feature is that a portion of the catalyst elements also diffuses thermally into the low density impurity regions 126 and 127, but the density is sufficiently low, and in particular the density in the interfaces 131 and 132 with the channel-forming region is less than $1\times10^{17}$ atoms/cm$^3$.

In the present invention, catalyst elements which are mainly introduced into the source and drain regions in step (3) mentioned above promote crystallization markedly while diffusing into the regions. Thus during activation, adequate effects can be obtained by heating to between 400 and 580° C., typically between 450 and 550° C., and furthermore, an annealing time of less than 8 hours, typically less than 4 hours, is adequate. In particular, if the catalyst elements are introduced by an ion implantation method or an ion doping method, as in step (4) of the second method, the catalyst elements are distributed uniformly from the beginning, and therefore crystallization progresses extremely easily.

Further, the density of the catalyst elements within the low density impurity regions is particularly low, and only slight improvements in crystallinity due to the catalyst elements resulting therefrom can be expected, except in the portions adjacent to the source/drain regions, but since the density of impurities which have been introduced is sufficiently low, activation will occur even at the low temperatures mentioned above.

A point of excellence in the present invention is that although catalyst elements which are harmful to silicon are added to the TFT, the density thereof is extremely low in the channel-forming region and the interfaces between the channel-forming region and the low density impurity regions, as outlined above (less than $1\times10^{17}$ atoms/cm$^3$). In particular, it is preferable in terms of TFT characteristics to have a suitably low density of catalyst element within the channel-forming region and the interfaces with the low density impurity regions.

At said interfaces, an N– I junction is formed for an N-channel type, and a P– I junction is formed for a P-channel type, and basically current flows only in the direction from N– to I or from I to P–, and current flowing in the opposite direction is suitably small. However, if a large amount of catalyst element and the like is present in the vicinity of such a junction, then leakage currents in the reverse direction occur due to the energy level resulting from said elements. This means that the leakage current (off current) with the TFT being in the unselected state (in other words when a negative voltage is applied to the gate electrode for an N-channel type and the reverse for a P-channel type) is high.

If, as in the present invention, the density of catalyst elements in the vicinity of the N– I junction or the P– I junction is suitably low, the leakage current in the reverse direction (i.e. the off current) can be adequately reduced. This is extremely advantageous if the TFT of the present invention is used, for example as a switching transistor in an active matrix circuit.

BRIEF DESCRIPTION OF THE DRAWINGS

FIGS. 1(A) to 1(B) show outline views of TFTs of the present invention.

DETAILED DESCRIPTION OF THE PREFERRED EMBODIMENTS

A more detailed description will now be given of the present invention based on the embodiments shown in the figures.

Embodiment 1

The present embodiment relates to the manufacture of a coplanar type N-channel type TFT which is used as a switching transistor in an active matrix circuit of a liquid crystal display device. In a switching transistor of an active matrix circuit, the source/drain regions are from time to time inverted depending on the operating conditions, but, for convenience in the following description, the region from among the source and drain regions which is connected to the data line of the matrix is termed the source, and that connected to the pixel electrode is termed the drain.

Figure 2A:
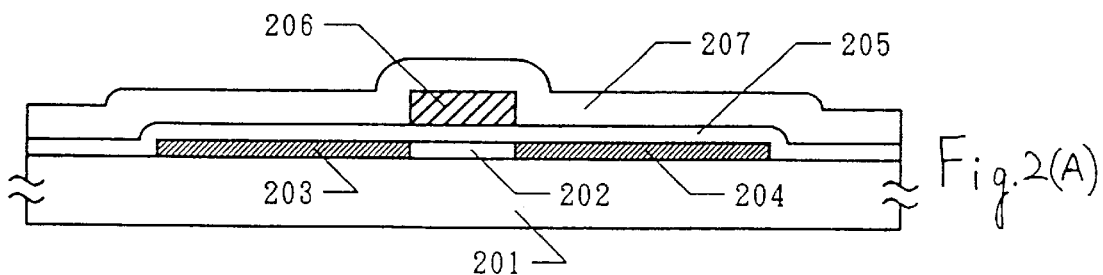
FIGS. 2(A) to 2(E) show cross sections in the fabrication process of embodiment 1.
Figure 2B:
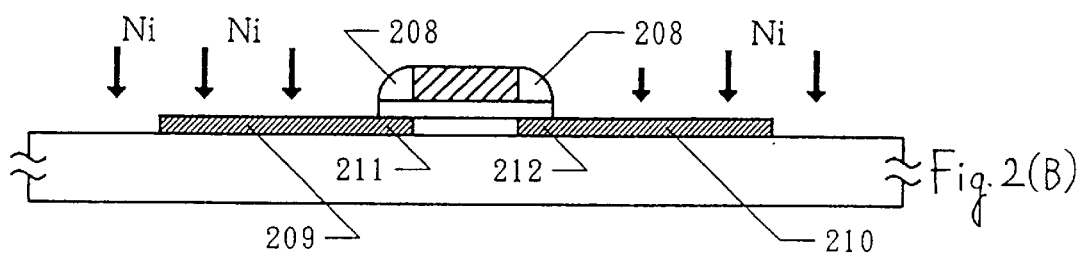
Figure 2C:
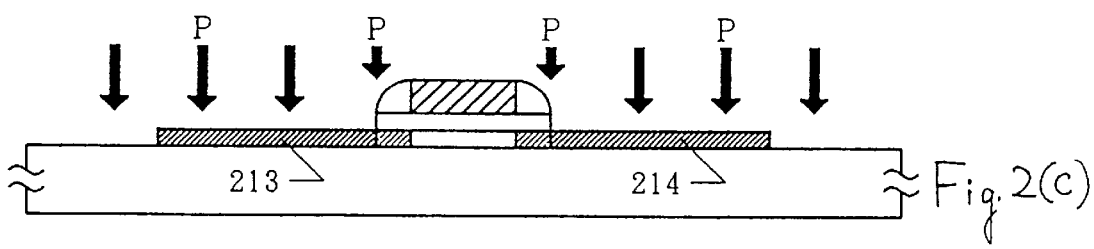
Figure 2D:
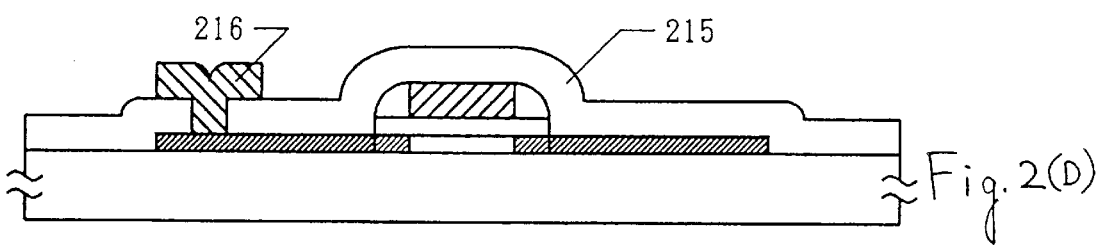
Figure 2E:
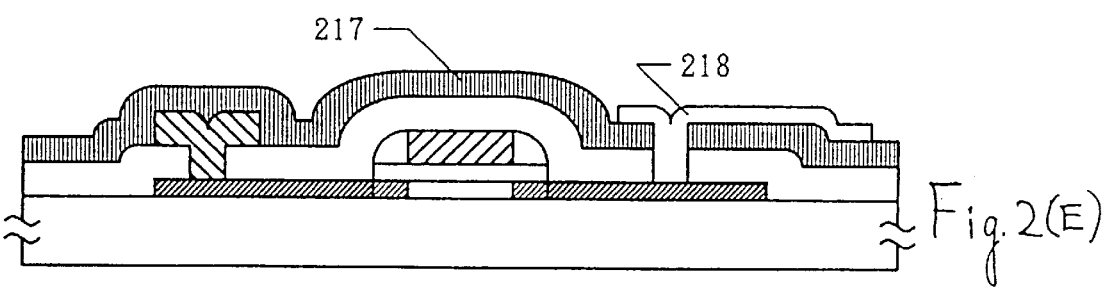

FIG. 2 shows cross sections of the fabrication steps of the present embodiment. Firstly, an intrinsic (I type) amorphous silicon film was deposited to a thickness of between 300 and 2000 Å, for example 1000 Å on a substrate (quartz) 201 by the plasma CVD method. The density of nickel, platinum, cobalt, iron and palladium in the amorphous silicon film was $1\times10^{17}$ atoms/cm$^3$.

The amorphous silicon film was then crystallized by thermal annealing for 48 hours at 600° C. in a nitrogen atmosphere. After the thermal annealing, the silicon film was etched to form island-shaped silicon regions, and furthermore a silicon oxide film 205 was deposited as a gate insulating film to a thickness of 1000 Å by the sputtering method. In the sputtering method, silicon oxide was used as the target, the substrate temperature during sputtering was between 200 and 400° C., for example 350° C., the sputtering atmosphere was a mixture of oxygen and argon, and the argon/oxygen ratio was between 0 and 0.5, for example less than 0.1

A silicon film (containing between 0.1 and 2% phosphorus) was then deposited to a thickness of between 3000 and 8000 Å, for example 6000 Å, by the low pressure CVD method. It should be noted that it is desirable for the formation of the silicon oxide film 205 by the sputtering method and the formation of the silicon film to be performed without a break. The silicon film was then etched, and a gate electrode 206 was formed.

A low density N-type impurity (phosphorus) was then implanted into the silicon region by the ion doping method with the gate electrode 206 as a mask. The ion doping method is a doping method in which plasma is generated in a low pressure atmosphere containing the impurity element, ions are produced, these are accelerated by a high voltage and irradiated into the body to be irradiated.

In the present embodiment, phosphine (PH$_3$), diluted with hydrogen (for example 1% PH$_3$–99% H$_2$) was used as the doping gas, and the acceleration voltage was between 60 and 90 kV, for example 80 kV. The dosage was between $1\times10^{12}$ and $8\times10^{13}$ atoms/cm$^2$ for example, $5\times10^{12}$ atoms/cm$^2$. As a result, N-type low density impurity regions 203 and 204 were formed. Further, impurities were not introduced into the portion immediately below the gate electrode, and thus a channel-forming region 202 was left.

After this, a silicon oxide film 207 was formed to a thickness of between 4000 and 12000 Å by the plasma CVD method. In the present invention, the thickness of the silicon oxide film 207 was the same as that of the gate electrode, 6000 Å. (FIG. 2 (A))

The silicon oxide films 207 and 205 were then etched by an anisotropic dry etching method. As a result, side walls 208 were formed on the side surfaces of the gate electrode 206. The width of the side walls 208 is determined by the height of the gate electrode 206 and the thickness of the silicon oxide film 207. In the present embodiment it was approximately 6000 Å.

Nickel ions were then introduced at a dosage of between $1\times10^{12}$ and $1\times10^{14}$ atoms/cm$^2$ by the ion implantation method. The acceleration voltage was suitably between 10 and 20 kV. At this time, nickel is not implanted into the regions 211 and 212 below the side walls 208, even though they are the same low density impurity regions 203 and 204, and implantation mainly occurs in the exposed portions 209 and 210 (these are the portions which later form the source/drain regions). (FIG. 2 (B))

After this, high density N-type impurities (phosphorus) were implanted by the ion doping method with the gate electrode 206 and the side wall 208 as a mask. In the present embodiment phosphine diluted with hydrogen (for example 5% $PH_3$ 95% $H_2$) was used as the doping gas and the acceleration voltage was between 10 and 30 kV, for example 20 kV. The dosage was between $1 \times 10^{14}$ and $8 \times 10^{15}$ atoms/$cm^2$, for example $2 \times 10^{14}$ atoms/$cm^2$. As a result, N-type high density impurity regions, in other words a source region 213 and a drain region 214 were formed. The regions in which the source/drain regions 213 and 214 were formed were approximately the same as the regions into which nickel had been implanted in the earlier process.

By thermal annealing at between 400 and 580° C., the impurities in the source/drain regions and the low density impurity regions 203, 204 were activated. In the present embodiment, the thermal annealing conditions were 550° C. for 2 hours. (FIG. 2 (C))

A silicon nitride film 215 was then formed to a thickness of between 4000 and 8000 Å by deposition using the plasma CVD method, and a conduct hole was formed to the source of the TFT. An aluminum film was then deposited by the sputtering method to a thickness of 6000 Å, this was etched and a source electrode 216 was formed. (FIG. 2 (D))

Furthermore, a silicon oxide film 217 was deposited to a thickness of between 2000 and 4000 Å by the plasma CVD method, and the silicon oxide film 217 and the silicon nitride film 215 were etched to form a contact hole on the drain region 214 side of the TFT. A transparent conducting film (for example an indium tin oxide covering) was then deposited by the sputtering method to a thickness of between 500 and 1000 Å forming a pixel electrode 218. An active matrix circuit was fabricated by the above steps. (FIG. 2 (E))

On measuring the density of nickel in the source/drain regions 213 and 214 and the channel-forming region 202 of the resulting thin film transistor by secondary ion mass spectrometry, the former was found to be between approximately $1 \times 10^{18}$ and $5 \times 10^{18}$ atoms/$cm^3$, and the latter was below the measurement range $1 \times 10^{16}$ atoms/$cm^3$. In particular, in the source/drain regions 213 and 214, nickel was observed to be in a low density state in the middle of the film, and its minimum value was $1 \times 10^{18}$ atoms/$cm^3$.

Embodiment 2

Figure 3A:
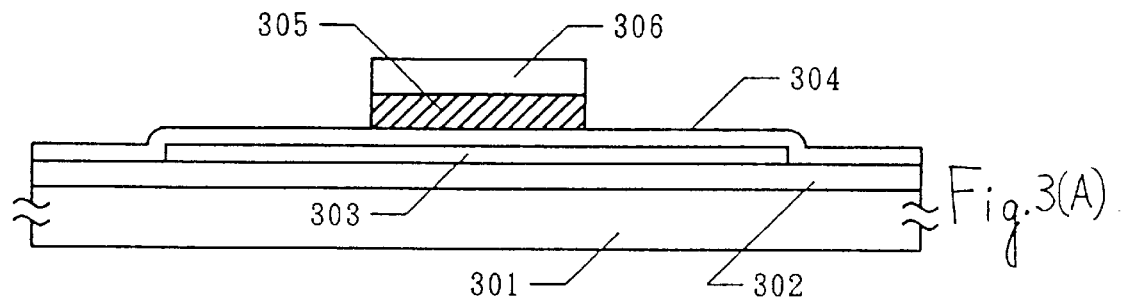
FIGS. 3(A) to 3(E) show cross sections in the fabrication process of embodiment 2.
Figure 3B:
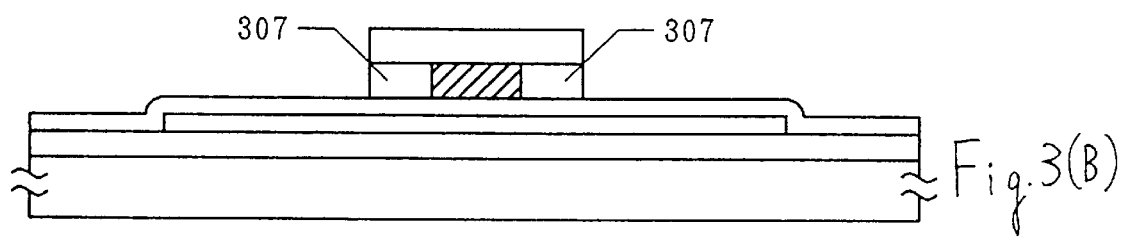
Figure 3C:
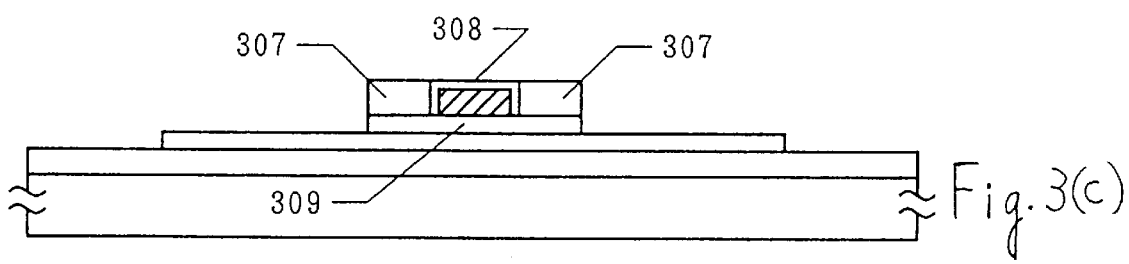
Figure 3D:
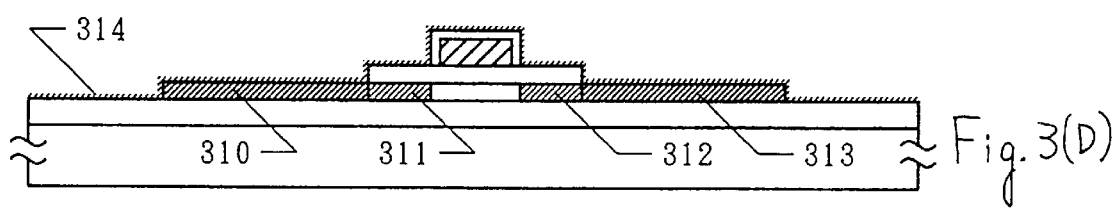
Figure 3E:
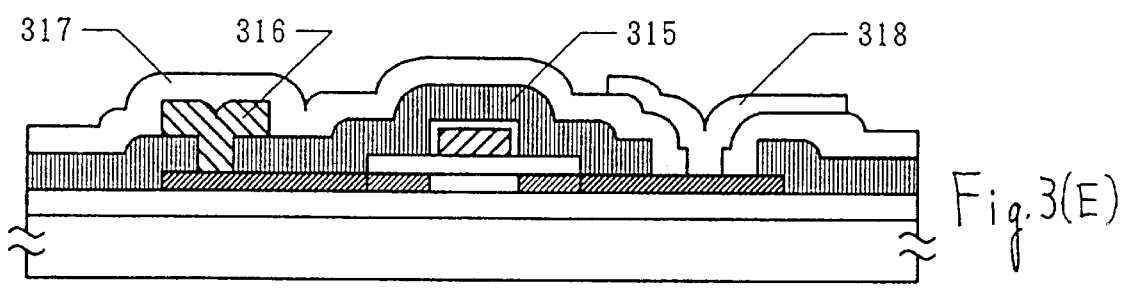

The present embodiment also relates to the manufacture of a coplanar type N-channel type TFT which is used as a switching transistor in an active matrix circuit of a liquid crystal display device, and the terminology for the source/drain regions is the same as in embodiment 1. FIG. 3 shows cross sections in the fabrication process of the present embodiment.

Firstly, silicon oxide was formed on a substrate (Corning 7059) 301 by the sputtering method to a thickness of 2000 Å as a base film 302. Furthermore, an intrinsic (I type) amorphous silicon film was deposited to a thickness of between 300 and 1000 Å, for example 500 Å, by the plasma CVD method. The amorphous silicon film was then thermal annealed for 1 hour at 400° C. in a nitrogen atmosphere, and hydrogen contained in the film was expelled.

Crystallization was then performed by irradiating with laser light. The laser is preferably an excimer laser such as a KrF excimer laser (wavelength 248 nm), and ArF excimer laser (wavelength 193 nm), an XeCl excimer laser (wavelength 308 nm), or an XeF excimer laser (wavelength 353 nm), a pulse oscillation laser such as an Nd: YAG laser (wavelength 1064 nm), the second harmonic thereof (wavelength 532 nm) or the third harmonic (wavelength 355 nm), or a continuous oscillation laser such as an Ar ion laser. In the present embodiment a KrF excimer laser was used. The energy density was suitably between 320 and 450 mJ/$cm^2$, but the optimum energy density varies depending on the silicon which has been formed, and therefore the optimum energy density was determined taking the conditions into account in advance.

The crystallized silicon film was then etched to form an island-shaped region 303.

Furthermore, a silicon oxide film 304 was deposited to a thickness of 1000 Å by the RF plasma CVD method using monosilane ($SiH_4$) and nitrous oxide ($N_2O$) as raw materials. In the present embodiment, monosilane was introduced into the reaction chamber at 10 SCCM, and nitrous oxide at 100 SCCM, the substrate temperatures 430° C., the reaction pressure was 0.3 Torr, and the supplied voltage (13.56 MHz) was 250 W. The film growth rate of the silicon oxide film 304 which was manufactured under the above conditions was approximately 1000 Å/minute, and the etching rate with a mixed solution (20° C.) of hydrofluoric acid 1, acetic acid 50 and ammonium fluoride 50 was approximately 1000 Å/minute.

An aluminum film was then deposited to a thickness of between 2000 and 8000 Å, for example 4000 Å, by the sputtering method, and in order to obtain the satisfactory adhesion, an extremely thin (between 50 and 200 Å) anodic oxide film (not shown) was formed on the surface thereof. A photoresist was then applied, a photoresist mask 306 was formed by a known photolithographic method, the aluminum film was etched and a gate electrode 305 was formed. Between 0.1 and 0.5 weight % of scandium (Sc) or yttrium (Y) were mixed into the aluminum in order to suppress abnormal crystal growth hillock during the heating and subsequent anodic oxidation steps. The photoresist mask 306 which had been used as an etching mask was left in place on the gate electrode 305. (FIG. 3 (A))

A current was then passed through this in an electrolyte to effect anodic oxidation, thereby forming an anodic oxide 307 with a thickness of between 1 and 5 μm, for example a thickness of 2 μm. The anodic oxidation was performed using an aqueous acid solution of between 3 and 20% citric acid, oxalic acid, phosphoric acid, chromic acid or sulfuric acid, for example, and a constant current of between 10 and 30 V should be applied to the gate electrode 305. In the present embodiment, anodic oxidation was performed in an oxalic acid solution (30° C.) with a pH of between 0.9 and 1.0 at a voltage of 10 V. The thickness of the anodic oxide 307 was controlled by means of the anodic oxidation time.

The anodic oxide 307 obtained in this way was porous. In this anodic oxidation step it was possible to suppress leakage of current from the photoresist, due to the thin anodic oxide film present between the gate electrode 305 and the photoresist mask 306, and it was possible to promote anodic oxidation on only the side surfaces of the gate electrode 307. (FIG. 3 (B))

The photoresist mask 306 was then peeled off, and an electric current was once again applied to the gate electrode 305 in an electrolyte solution. On this occasion an ethylene glycol ammonia solution with a pH of between 6.9 and 7.1, containing at least one of tartaric acid, boric acid or nitric acid at between 3 and 10% was used. A satisfactory oxide film could be obtained if the temperature of the solution was less than room temperature, which was approximately 10° C. Thus an anodic oxide 308 was formed on the upper surface and the side surface of the gate electrode 305. The thickness of the anodic oxide 308 was approximately proportional to the applied voltage, and with an applied voltage of 150 V, a 2000 Å and anodic oxide 308 was formed. The anodic oxide 308 was fine and hard, and was then advantageous in protecting the gate electrode 305 during subsequent heating steps.

The silicon oxide film 304 was then etched by the dry etching method. The porous anodic oxide 307 is not etched during this etching, and therefore the silicon oxide 309 below of this also remains without being etched. (FIG. 3 (C))

The anodic oxide 307 was then etched using a mixture of phosphoric acid, acetic acid and nitric acid. In this etching only the anodic oxide 307 was etched, and the etching rate was approximately 600 Å/minute. The gate insulating film 309 below this remained without alteration.

An impurity (phosphorus) was then implanted into the silicon region by the plasma doping method using the gate electrode and the gate insulating film 309 as a mask. Phosphine ($PH_3$) was used as the doping gas, and doping was performed in two stages. In the first stage, the acceleration voltage was 80 kV, and the dosage was $5 \times 10^{12}$ atoms/cm$^2$. In this doping, the ions passed through the gate insulating film 309 and were also implanted into the region below this, since the dosage at this time was low, low density impurity regions 311 and 312 were formed. In the second stage, the acceleration voltage was 30 kV and the dosage was $5 \times 10^{14}$ atoms/cm$^2$. During this doping, the ions did not pass through the gate insulating film 309, and, in the main, implanting occurred in the exposed portions of the silicon active layer. Since the dosage at this time was larger than in the first stage doping, a source region 310 and a drain region 313 were formed.

After this, an extremely thin covering 314 of nickel acetate was formed using the spin coating method. It is advantageous to form a thin silicon oxide film on the surface of the source/drain regions 310 and 313 prior to spin coating by treating with aqueous hydrogen peroxide (or a mixture of this with ammonia) or the like.

Here, a 10 ppm aqueous solution of nickel acetate was used, and by spin coating and spin drying this an extremely thin nickel acetate film 314 was formed over the entire substrate surface. At this time the nickel acetate solution would be repelled if a silicon oxide film were not formed on the surface. (FIG. 3 (D))

After this, impurities in the source/drain regions 310 and 313 and in the low density impurity regions 311 and 312 were activated by thermal annealing for 4 hours at 450° C. in a nitrogen atmosphere. At this time, the nickel acetate film is essentially bonded to the source/drain regions 310 and 313 (strictly, although a thin silicon oxide film is present in between, this does not cause any hindrance to the diffusion of nickel during thermal annealing) but the nickel acetate breaks down readily at temperatures of 400° C. or more to form nickel metal, this is diffused into the source region 310 and the drain region 313, and recrystallization of the regions progresses readily. The low density impurity regions 311 and 312 are also activated due to the thermal annealing.

A silicon oxide film 315 was then deposited to a thickness of 4000 Å as an interlayer insulating layer by the plasma CVD method, using TEOS as the raw material, and contact holes were formed therein to the source/drain regions 310 and 313. A source electrode/wiring 316 was then formed using a multilayer film of titanium and aluminum. No electrode was formed in the contact hole of the drain electrode 313 at this stage. A silicon nitride film 315 was then deposited to a thickness of 2000 Å by the plasma CVD method, and a contact hole was once again formed inside the contact hole to the drain region 313 which had been formed previously, and a pixel electrode 318 comprising a transparent conducting film was attached thereto. The active matrix circuit was fabricated by the above steps. (FIG. 3 (E))

Embodiment 3

Figure 4A:
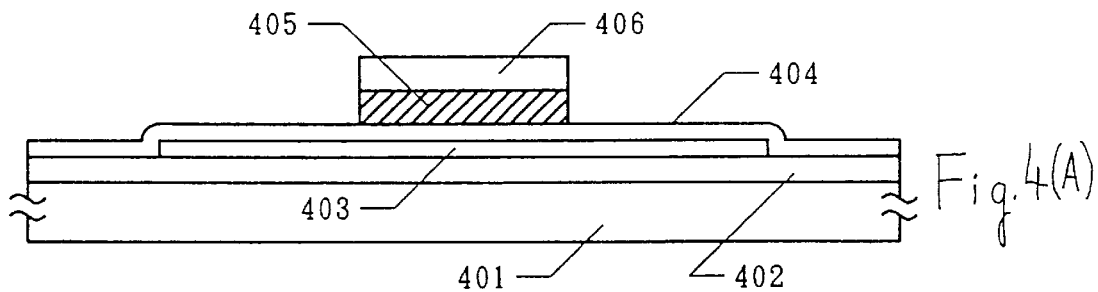
FIGS. 4(A) to 4(E) show cross sections in the fabrication process of embodiment 3.
Figure 4B:
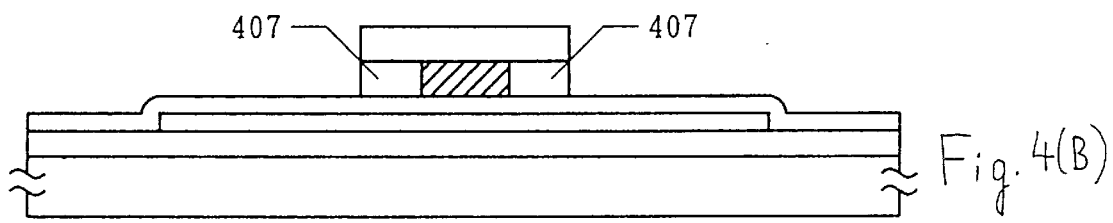
Figure 4C:
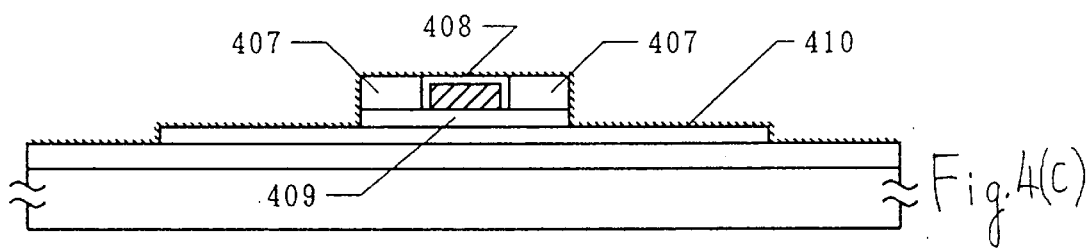
Figure 4D:
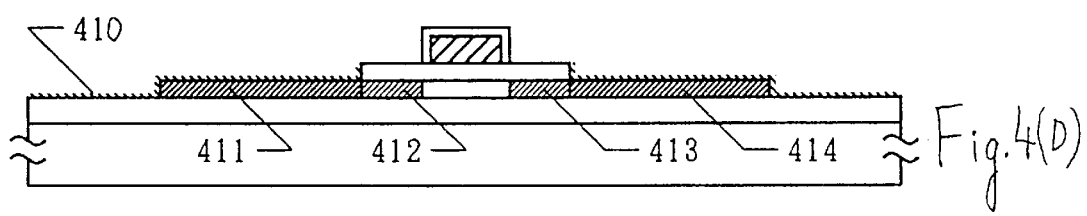
Figure 4E:
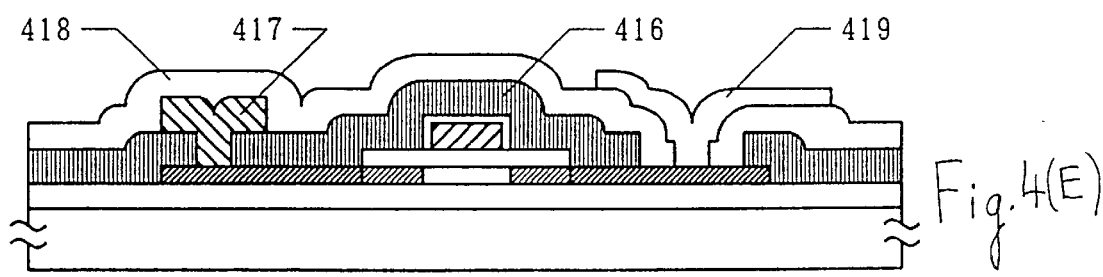

FIG. 4 shows the fabrication steps for the N-channel type TFT indicated in the present embodiment. Firstly, a silicon oxide base film 402 was formed to a thickness of 2000 Å on a substrate (Corning 7059) 401 by the sputtering method. An intrinsic (I type) amorphous silicon film was then deposited to a thickness of 500 Å by the plasma CVD method. The amorphous silicon film was then thermally annealed for 1 hour at 400° C. in a nitrogen atmosphere, and hydrogen contained in the film was expelled.

Crystallization was then performed by irradiation with laser light. A KrF excimer laser (wavelength 248 nm) was used as the laser. The radiation energy density was 350 mJ/cm$^2$.

After this, an island-shaped silicon region 403 was formed by etching the crystallized silicon film. A silicon oxide film 404, which would become the gate insulating film, was then deposited to a thickness of 1000 Å by the plasma CVD method.

An aluminum film was then deposited to a thickness of 4000 Å by the sputtering method, and in order to obtain satisfactory adhesion of the photoresist, an extremely thin (between 50 and 200 Å) anodic oxide film (not shown) was formed on the surface. A photoresist mask 406 was then formed, and the aluminum film was etched to form a gate electrode 405. It should be noted that between 0.1 and 0.5 weight % of scandium (Sc) or yttrium (Y) was mixed into the aluminum in order to suppress abnormal crystal growth (hillock) during heating and subsequent anodic oxidation steps. The photoresist mask 406 which had been used as the etching mask was left in place on the gate electrode 405. (FIG. 4 (A))

This was then anodic oxidized by passing a current through in an electrolyte, thereby forming an anodic oxide 407 to a thickness of between 1 and 5 $\mu$m, for example to a thickness of 2 $\mu$m. The anodic oxidation is performed in an aqueous acid solution of between 3 and 20% citric acid, oxalic acid, phosphoric acid, chromic acid or sulfuric acid, for example, and a constant current at between 10 and 30 V was applied to the gate electrode 405. In the present embodiment, anodic oxidation was performed in an oxalic acid solution (30° C.) with a pH of between 0.9 and 1.0, at a voltage of 10 V. The thickness of the anodic oxide 407 is controlled by the anodic oxidation period.

The anodic oxide 407 obtained in this way was porous. In the anodic oxidation step, it is possible to suppress leak of current from the photoresist mask 406, due to the thin anodic oxide film which is present between the gate electrode 405 and the photoresist mask 406, and it is possible to promote anodic oxidation selectively at the side surfaces of the gate electrode 405. (FIG. 4 (B))

The photoresist mask 406 was then peeled off, and an electric current was once again applied to the gate electrode 405 in an electrolyte solution. At this time, an ethylene glycol ammonia solution with a pH of between 6.9 and 7.1, containing at least one of between 3 and 10% tartaric acid, boric acid and nitric acid, was used. A satisfactory oxide film was obtained if the temperature of the solution was less than room temperature, which was approximately 10° C. Thus an anodic oxide 408 was formed on the upper surface and the side surfaces of the gate electrode. The thickness of the anodic oxide 408 was approximately proportional to the applied voltage, and with an applied voltage of 150 V, an anodic oxide 408 with a thickness of 2000 Å was formed. The anodic oxide 408 was fine and hard, and was advantageous in protecting the gate electrode 405 in subsequent heating steps.

The silicon oxide film 404 was then etched using the dry etching method. As a result, part of the active layer was exposed. Further, the porous anodic oxide 407 was not etched during this etching, and therefore the silicon oxide film 409 below this remained unetched. After this, an extremely thin oxide film (not shown) was formed, after which an extremely thin covering 410 of nickel acetate was formed by the spin coating method. At this time, the nickel was in a state of contact with the exposed surface of the active layer 403. Further, the active layer 403 below the remaining silicon oxide film 409 remained in a state in which it was not in contact with the nickel. (FIG. 4 (C))

Heat treatment was then performed in this state at 350° C., and a nickel silicide layer was formed on the exposed surface of the active layer. The porous anodic oxide 407 was then removed by etching. The state shown in FIG. 4 (D) was thus obtained.

An impurity (phosphorus) was then implanted into the silicon region by the plasma doping method, with the gate electrode 405 and the gate insulating film 409 as a mask. Phosphine ($PH_3$) was used as the doping gas, and doping was performed in two stages. In the first stage, the acceleration voltage was 80 kV and the dosage was $5 \times 10^{12}$ atoms/cm$^2$. During this doping, the ions passed through the gate insulating film 409 and were also implanted into the region below this. At this time, the gate insulating film 409 functions as a semipermeable mask, and therefore the dosage to the regions 412 and 413 below the gate insulating film 409 is small. Thus low density impurity regions 412 and 413 were formed.

Second doping was then performed. The acceleration voltage in the second doping was 30 kV and the dosage was $5 \times 10^{14}$ atoms/cm$^2$. In this doping, the ions do not pass through the gate insulating film 409, and implantation occurred mainly in the exposed portions of the silicon active layer 403. At this time, the dosage of ions implanted into the exposed region of the active layer 403 was large, and therefore a source region 411 and a drain region 414 were formed as high density impurity regions.

Thermal annealing was then performed for 4 hours at 450° C. in a nitrogen atmosphere, and impurities within the source/drain regions 411 and 414 and the low density impurity regions 412 and 413 were activated. A nickel silicide film is essentially bonded at this time to the source/drain regions 411 and 414 (strictly, a thin silicon oxide film is present in between, but this in no way hinders dispersion of nickel during the thermal annealing), but the nickel silicide readily breaks down to nickel metal at temperatures of 400° C. or more, and this diffuses into the source region 411 and the drain region 414, and thus recrystallization of these regions progresses readily. The low density impurity regions 412 and 413 are also activated during this thermal annealing.

A silicon oxide film 416 was then deposited as an interlayer insulating layer to a thickness of 4000 Å by the plasma CVD method using TEOS as the raw material, and contact holes to the source/drain regions 411 and 414 were formed therein. A source electrode/wiring 417 was then formed using a multilayer film of titanium and aluminum. At this stage, no electrode was formed in the contact hole of the drain region 414.

A silicon nitride film 418 was then deposited to a thickness of 2000 Å by the plasma CVD method, and a contact hole was once again formed inside the contact hole to the drain region 414 which had been previously formed, and a pixel electrode 419 comprising a transparent conducting film was connected thereto. An active matrix circuit was manufactured by the above steps. (FIG. 4 (E))

In the present invention as outlined above, by activating at a low temperature such as 450° C. and for a short time such as 4 hours, impurities with which the silicon has been doped in order to impart a conductor type, it is possible to improve the throughput. In addition, in the past, when processes at 600° C. or more were adopted, there were problems resulting from a reduction in the yield due to shrinkage of the glass substrate, but it has been possible to solve such problems at a stroke by adopting the present invention.

This means that it is possible to treat substrates with a large surface area at one go. To elaborate, by treating a substrate which has a large surface area, it is possible to cut out a large number of semiconductor circuits (for example matrix circuits) from a single substrate, and it is therefore possible to reduce unit costs considerably. When this is applied to liquid crystal displays, it is possible to plan to improve productivity and improve characteristics. Thus the present invention is advantageous in industry.

What is claimed is:

1. A thin film transistor comprising:
    a source region, a drain region and a channel-forming region which comprise crystalline silicon and are provided on an insulating surface, said channel-forming region being provided between said source region and said drain region,
    wherein said source region and said drain region contain a catalyst element, and density of said catalyst element within said source region and said drain region exceeds $1 \times 10^{17}$ atoms/cm$^3$, and
    wherein said channel-forming region contains a catalyst element, and density of said catalyst element in said channel-forming region is less than $1 \times 10^{17}$ atoms/cm$^3$.

2. The transistor of claim 1 wherein said catalyst element is at least one element selected from nickel, iron, cobalt, palladium and platinum.

3. A thin film transistor comprising:
    a source region, a drain region and a channel-forming region which comprise crystalline silicon and are provided on an insulating surface, said channel-forming region being provided between said source region and said drain region;
    a gate insulating film provided on said channel-forming region; and
    a gate electrode provided on said gate insulating film,
    wherein said source region and said drain region contain a catalyst element, and a density of said catalyst element within said source region and said drain region exceeds $1 \times 10^{17}$ atoms/cm$^3$, and
    wherein said channel-forming region contains the same element as said catalyst element, and density of said catalyst element in said channel-forming region is less than $1 \times 10^{17}$ atoms/cm$^3$.

4. The transistor of claim 3 wherein said catalyst element is at least one element selected from nickel, iron, cobalt, palladium and platinum.

5. A thin film transistor comprising:
    a gate electrode provided on an insulating surface;
    a gate insulating film provided on said gate electrode; and
    a source region, a drain region and a channel-forming region which comprise crystalline silicon and are provided on said gate insulating film, said channel-forming region being provided between said source region and said drain region, wherein said source region and said drain region contain a catalyst element, and density of said catalyst element within said source region and said drain region exceeds $1\times10^{17}$ atoms/cm$^3$, and wherein said channel-forming region contains the same element as said catalyst element, and density of said catalyst element in said channel-forming region is less than $1\times10^{17}$ atoms/cm$^3$.

6. The transistor of claim 5 wherein said catalyst element is at least one element selected from nickel, iron, cobalt, palladium and platinum.

7. A thin film transistor comprising:

a source region, a drain region and a channel-forming region which comprise crystalline silicon and are provided on an insulating surface, said channel-forming region being provided between said source region and said drain region;

a gate insulating film provided on said channel-forming region; and a gate electrode provided on said gate insulating film, wherein said source region and said drain region contain a catalyst element, and density of said catalyst element within said source region and said drain region exceeds $1\times10^{17}$ atoms/cm$^3$, wherein said channel-forming region contains the same element as said catalyst element, and density of said catalyst element in said channel-forming region is less than $1\times10^{17}$ atoms/cm$^3$, and wherein said source region and said drain region contain phosphorus.

8. The transistor of claim 7 wherein said catalyst element is at least one element selected from nickel, iron, cobalt, palladium and platinum.

9. A thin film transistor comprising:

a gate electrode provided on an insulating surface;

a gate insulating film provided on said gate electrode; and a source region, a drain region and a channel-forming region which comprise crystalline silicon and are provided on said gate insulating film, said channel-forming region being provided between said source region and said drain region, wherein said source region and said drain region contain a catalyst element, and density of said catalyst element within said source region and said drain region exceeds $1\times10^{17}$ atoms/cm$^3$, wherein said channel-forming region contains the same element as said catalyst element, and density of said catalyst element in said channel-forming region is less than $1\times10^{17}$ atoms/cm$^3$, and wherein said source region and said drain region contain phosphorus.

10. The transistor of claim 9 wherein said catalyst element is at least one element selected from nickel, iron, cobalt, palladium and platinum.

11. A thin film transistor comprising:

a source region, a drain region and a channel-forming region which comprise crystalline silicon and are provided on an insulating surface, said channel-forming region being provided between said source region and said drain region;

a gate insulating film provided on said channel-forming region; and a gate electrode provided on said gate insulating film, wherein said source region and said drain region contain a catalyst element, and density of said catalyst element within said source region and said drain region exceeds $1\times10^{17}$ atoms/cm$^3$, wherein said channel-forming region contains the same element as said catalyst element, and density of said catalyst element in said channel-forming region is less than $1\times10^{17}$ atoms/cm$^3$, and wherein said source region and said drain region have a sheet resistance less than 10 k$\Omega$/□.

12. The transistor of claim 11 wherein said catalyst element is at least one element selected from nickel, iron, cobalt, palladium and platinum.

13. A thin film transistor comprising:

a gate electrode provided on an insulating surface;

a gate insulating film provided on said gate electrode; and a source region, a drain region and a channel-forming region which comprise crystalline silicon and are provided on said gate insulating film, said channel-forming region being provided between said source region and said drain region, wherein said source region and said drain region contain a catalyst element, and density of said catalyst element within said source region and said drain region exceeds $1\times10^{17}$ atoms/cm$^3$, and wherein said channel-forming region contains the same element as said catalyst element, and density of said catalyst element in said channel-forming region is less than $1\times10^{17}$ atoms/cm$^3$, and wherein said source region and said drain region have a sheet resistance less than 10 k$\Omega$/□.

14. The transistor of claim 13 wherein said catalyst element is at least one element selected from nickel, iron, cobalt, palladium and platinum.

15. A thin film transistor comprising:

a pair of high density impurity regions and a channel-forming region which comprise crystalline silicon and are provided on an insulating surface, said channel-forming region being provided between said pair of high density impurity regions;

at least one low density impurity region provided between said channel-forming region and one of said high density impurity regions;

a gate insulating film provided on said channel-forming region; and a gate electrode provided on said gate insulating film, wherein said pair of high density impurity regions contain a catalyst element, and density of said catalyst element within said pair of high density impurity regions exceeds $1\times10^{17}$ atoms/cm$^3$, and wherein said channel-forming region contains the same element as said catalyst element, and density of said catalyst element in said channel-forming region is less than $1\times10^{17}$ atoms/cm$^3$.

16. The transistor of claim 15 wherein said catalyst element is at least one element selected from nickel, iron, cobalt, palladium and platinum.

17. The transistor of claim 15 wherein said pair of high density impurity regions are a source region and a drain region.

18. A thin film transistor comprising:

a gate electrode provided on an insulating surface;

a gate insulating film provided on said gate electrode; and a pair of high density impurity regions and a channel-forming region which comprise crystalline silicon and are provided on said gate insulating film, said channel-forming region being provided between said pair of high density impurity regions; and at least one low density impurity region provided between said channel-forming region and one of said high density impurity regions, wherein said pair of high density impurity regions contain a catalyst element, and density of said catalyst element within said pair of high density impurity regions exceeds $1\times10^{17}$ atoms/cm$^3$, and wherein said channel-forming region contains the same element as said catalyst element, and density of said catalyst element in said channel-forming region is less than $1\times10^{17}$ atoms/cm$^3$.

19. The transistor of claim 18 wherein said catalyst element is at least one element selected from nickel, iron, cobalt, palladium and platinum.

20. The transistor of claim 18 wherein said pair of high density impurity regions are a source region and a drain region.

* * * * *